US008846187B2

(12) United States Patent
Fukuda

(10) Patent No.: US 8,846,187 B2
(45) Date of Patent: Sep. 30, 2014

(54) TRANSPARENT GAS BARRIER FILM AND METHOD FOR PRODUCING TRANSPARENT GAS BARRIER FILM

(75) Inventor: Kazuhiro Fukuda, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 809 days.

(21) Appl. No.: 12/449,119

(22) PCT Filed: Jan. 25, 2008

(86) PCT No.: PCT/JP2008/051062
§ 371 (c)(1),
(2), (4) Date: Jul. 23, 2009

(87) PCT Pub. No.: WO2008/096617
PCT Pub. Date: Aug. 14, 2008

(65) Prior Publication Data
US 2010/0003482 A1    Jan. 7, 2010

(30) Foreign Application Priority Data

Feb. 6, 2007   (JP) ................................. 2007-026536

(51) Int. Cl.
*B32B 7/02*   (2006.01)
*B32B 9/00*   (2006.01)
*C23C 16/30*   (2006.01)

(52) U.S. Cl.
CPC ...................................... *C23C 16/30* (2013.01)
USPC ............................ 428/218; 428/339; 427/569

(58) Field of Classification Search
USPC .................... 428/218, 339; 427/569
See application file for complete search history.

(56) References Cited

U.S. PATENT DOCUMENTS

| 6,268,695 B1 | 7/2001 | Affinito |
| 2004/0067308 A1 | 4/2004 | Zheng et al. |

(Continued)

FOREIGN PATENT DOCUMENTS

| JP | 53-012953 | 2/1978 |
| JP | 58-217344 A | 12/1983 |

(Continued)

OTHER PUBLICATIONS

Derwent_Abstract_2006522319; Fukuda; Transparent gas-barrier film for display materials, has ceramic layers and interlayer having lower elastic modulus than ceramic layers and preset water-vapor permeability coefficient; Jul. 26, 2006; Derwent; whole abstract.*

(Continued)

*Primary Examiner* — Aaron Austin
*Assistant Examiner* — Tahseen N Khan
(74) *Attorney, Agent, or Firm* — Holtz Holtz Goodman & Chick PC

(57) ABSTRACT

Disclosed is a transparent gas barrier film having good transparency and good gas barrier properties, which exhibits excellent adhesion even after storage under severe environmental conditions, and does not deteriorate even when a large impact is applied thereto. The transparent gas barrier film is characterized by having, on a resin base, at least two layers having different elastic moduluses. The transparent gas barrier film is further characterized in that the elastic modulus difference between adjoining layers is not less than 1 GPa but not more than 20 GPa, and each layer has a thickness of not less than 1 nm but not more than 10 nm.

9 Claims, 4 Drawing Sheets

(56) References Cited

U.S. PATENT DOCUMENTS

| | | |
|---|---|---|
| 2004/0253451 A1 | 12/2004 | Kawashima et al. |
| 2008/0085418 A1 | 4/2008 | Fukuda et al. |
| 2008/0260956 A1* | 10/2008 | Sakurai et al. ............ 427/387 |
| 2009/0051272 A1 | 2/2009 | Fukuda et al. |
| 2010/0003483 A1 | 1/2010 | Fukuda |
| 2010/0009147 A1 | 1/2010 | Fukuda |

FOREIGN PATENT DOCUMENTS

| | | |
|---|---|---|
| JP | 10-086267 A | 4/1998 |
| JP | 10-249990 A | 9/1998 |
| JP | 11-240102 A | 9/1999 |
| JP | 2003-276111 A | 9/2003 |
| JP | 2004-082522 A | 3/2004 |
| JP | 2005-088431 A | 4/2005 |
| JP | 2005-169994 A | 6/2005 |
| JP | 2005-169996 A | 6/2005 |
| JP | 2006-187966 A | 7/2006 |
| JP | 2006-224408 A | 8/2006 |
| WO | WO 2006/033233 A1 | 3/2006 |
| WO | WO 2006075490 A1 * | 7/2006 |
| WO | WO 2006/087941 A | 8/2006 |
| WO | WO 2006087941 A1 * | 8/2006 |

OTHER PUBLICATIONS

Machine_English_Translation_WO_2006075490_A1; Fukuda; Jul. 26, 2006, JPO, whole document.*
U.S. Appl. No. 12/449,186, filed Jul. 27, 2009, Confirmation No. 5348.
U.S. Appl. No. 12/449,189, filed Jul. 27, 2009, Confirmation No. 1766.
Japanese Office Action dated Feb. 29, 2012 (and English translation thereof) issued Japanese Application No. 2008-557061, which is a Japanese counterpart of the *present* application.
Extended European Search Report (EESR) dated Mar. 12, 2012 (in English) in Counterpart European Application No. 08703889,9.
Kim Tae et al.: "Transparent hybrid inorganic/organic barrier coatings for plastic organic light-emitting diode substrates": Journal of Vacuum Science and Tech.: A 23(4); Jun. 27, 2005: pp. 971-977.

* cited by examiner

TRANSPARENT GAS BARRIER FILM AND METHOD FOR PRODUCING TRANSPARENT GAS BARRIER FILM

This application is the United States national phase application of International Application PCT/JP2008/051062 filed Jan. 25, 2008.

This applications claims the priority of Japanese Application No. 2007-026536 filed Feb. 6, 2007, the entire content of which is hereby incorporated by reference.

TECHNICAL FIELD

The present invention relates to a transparent gas barrier film mainly used in packaging material for food and medicinal products and as packaging for electronic devices, or used in display material as plastic substrates for organic electroluminescence elements and liquid crystals and the like.

BACKGROUND OF THE INVENTION

Gas barrier films in which a thin layer of a metal oxide such as aluminum oxide, magnesium oxide, or silicon oxide is formed on a plastic substrate or on a film surface, have been widely used in packaging of products which require a barrier for various types of gases such as water vapor and oxygen as well as in packaging to prevent changes in the quality of foods, industrial products, medicinal products and the like. Aside from the use for packaging, gas barrier films are also used as substrates for liquid crystal displays, solar cells, organic electroluminescence (EL) and the like.

An aluminum foil is widely used as the packaging material in these kinds of fields, but disposal after use is problematic and in addition, these are basically opaque materials and the fact that the content cannot be checked from the outside is also problematic. In addition, transparency is required for display materials, and these opaque materials cannot be used.

Meanwhile, a polyvinylidene chloride resin or copolymer resin materials of vinylidene chloride and another polymer or a material which is provided with gas barrier properties by coating these vinylidene chloride resins on polypropylene resins, polyester resins or polyamide resins are widely used as packaging materials in particular, but at the incineration step, chlorine based gases are generated and this is currently problematic in view of environment preservation. Furthermore, the gas barrier properties are not necessarily sufficient and so they cannot be used in fields where high barrier properties are required.

In particular, in transparent substrates which are used more and more in liquid crystal display elements and organic EL elements in particular, in addition to the requirement in recent years to be light weight and large in size, there are also high level requirements of long term reliability and a high degree of freedom with regards to configuration. In addition, film substrates such as transparent plastic are now being used instead of glass substrates which easily break, and are heavy and difficult in increasing screen size. For example, Japanese Patent Publication Open to Public Inspection (hereafter referred to as JP-A) H02-251429 and JP-A H06-124785 disclose an example in which a polymer film is used as the substrate for an organic electroluminescence element.

However, there has been a problem in that the gas barrier property of a film substrate such as a transparent plastic film is inferior to that of a glass substrate. For example, when such a substrate having an insufficient gas barrier property is used as a substrate of the organic electroluminescence element, water vapor and air may penetrate the substrate to degrade the organic layer, resulting in loss of light emitting properties or durability. In addition, when a polymer substrate is used as an electronic device substrate, oxygen may pass through the polymer substrate, penetrate and diffuse into the electronic device causing problems such as deterioration of the device or making it impossible to maintain the required degree of vacuum in the electronic device.

In order to solve this type of problem, a gas barrier film substrate in which a thin metal oxide layer is formed on a film substrate is known. Layers in which silicon oxide (Patent Document 1) or aluminum oxide (Patent Document 2) is deposited on the plastic film are also known as the gas barrier used in packaging material or liquid crystal element. In either case, currently the layers have water vapor barrier properties that do not exceed about 2 $g/m^2$/day or oxygen transmission that does not exceed about 2 $ml/m^2$/day. In recent years, due to the EL displays which require greater gas barrier properties, increasing size of liquid crystal displays and development of high definition displays, water vapor barrier of around $10^{-3}$ $g/m^2$/day is required for the gas barrier properties of the film substrate.

A gas barrier film having a structure in which a high density ceramic layer and flexible polymer layer which softens impact from outside are alternately laminated a number of times, is proposed as a method for meeting these requirements of high water vapor barrier properties (see Patent Document 3, for example). However, because the composition of the ceramic layer and the polymer layer is generally different, adhesion at the respective adhesion interfaces deteriorate and cause product deterioration such as layer stripping. In particular, the occurrence of adhesion deterioration is outstanding under severe conditions such as high temperature and high humidity or exposure to ultraviolet radiation for an extended period, and thus early improvement is desired.

A gas barrier film having a gradient structure in which a high density ceramic portion and flexible polymer portion which softens impact from outside are gradually changed without forming an interface, is proposed for this problem (see Patent Document 3, for example). However, adhesion does not deteriorate though it has different natures because there in no interface, to the contrarily, relaxation performance against impact from outside is insufficient, and rupture vibration is not inhibited when the impact has large rate of time change and sometimes cracking is propagated, and thus early improvement is desired.

Patent Document 1 Examined Japanese Patent Publication No. 53-12953
Patent Document 2 JP-A S58-217344
Patent Document 3 U.S. Pat. No. 6,268,695
Patent Document 4 JP-A H10-249990

SUMMARY OF THE INVENTION

The present invention was intended in view of the above-described problems and an object thereof is to provide a transparent gas barrier film which has excellent adhesion even when stored under severe conditions, and has favorable transparency and gas barrier resistance, as well as its production method.

The above described object of this invention is attained as follow.

1. A transparent gas barrier film comprising a resin substrate having thereon two or more layers having different elastic modulus each other wherein a difference of elastic modulus of adjacent layers is not less than 1 GPa and not more than 20 GPa and a thickness of not less than 1 nm and not more than 10 nm.

2. The transparent gas barrier film described in item 1, wherein the layers having different elastic modulus are layer unit A in which an elastic modulus gradually increase from low elastic modulus layer to high elastic modulus layer from the resin substrate.
3. The transparent gas barrier film described in item 1, wherein the layers having different elastic modulus are layer unit B in which an elastic modulus gradually decrease from high elastic modulus layer to low elastic modulus layer from the resin substrate.
4. The transparent gas barrier film described in item 1, wherein the layers having different elastic modulus are composed of layer unit A in which an elastic modulus gradually increase from low elastic modulus layer to high elastic modulus layer and layer unit B in which an elastic modulus gradually decrease from high elastic modulus layer to low elastic modulus layer, from the resin substrate.
5. The transparent gas barrier film described in item 4, wherein at least two units of composite unit composed of the layer unit A and the layer unit B are layered from the resin substrate.
6. The transparent gas barrier film described in items 4 or 5, wherein the unit A is positioned at a resin substrate side.
7. The transparent gas barrier film described in any one of items 1 to 6, wherein a layer of maximum elastic modulus among the layers having different elastic modulus is a ceramic layer.
8. The transparent gas barrier film described in item 6, wherein a density ratio Y $(=\rho f/\rho b)$ is $1 \geq Y > 0.95$ and a residual stress of the ceramic layer is not less than 0.01 MPa and not more than 10 MPa, wherein $\rho f$ is a density of the ceramic layer and $\rho b$ is a density of a thermal oxide layer or thermal nitride layer formed by thermally oxidation or thermally nitridation of a metal of the base material of the ceramic layer.
9. The transparent gas barrier film described in item 7 or 8 above, wherein the ceramic layer comprises at least one selected from silicon oxide, silicon nitride, silicon oxide nitride and aluminum oxide.
10. A manufacturing method of a transparent gas barrier film, manufacturing the transparent gas barrier film described in any one of the items 1 to 9, wherein at least one of constitution layer is formed by a plasma CVD method at atmospheric pressure or approximately atmospheric pressure.
11. The manufacturing method of a transparent gas barrier film described in item 10, wherein a plasma output density for forming each of constitution layer is within a range of ±50% of the average plasma output density for forming each of constitution layer.

Advantage of the Invention

A transparent gas barrier film and its production method can be provided, which has excellent adhesion even when stored under severe conditions, and has favorable transparency and gas barrier resistance.

DESCRIPTION OF SYMBOLS

Figure 1:
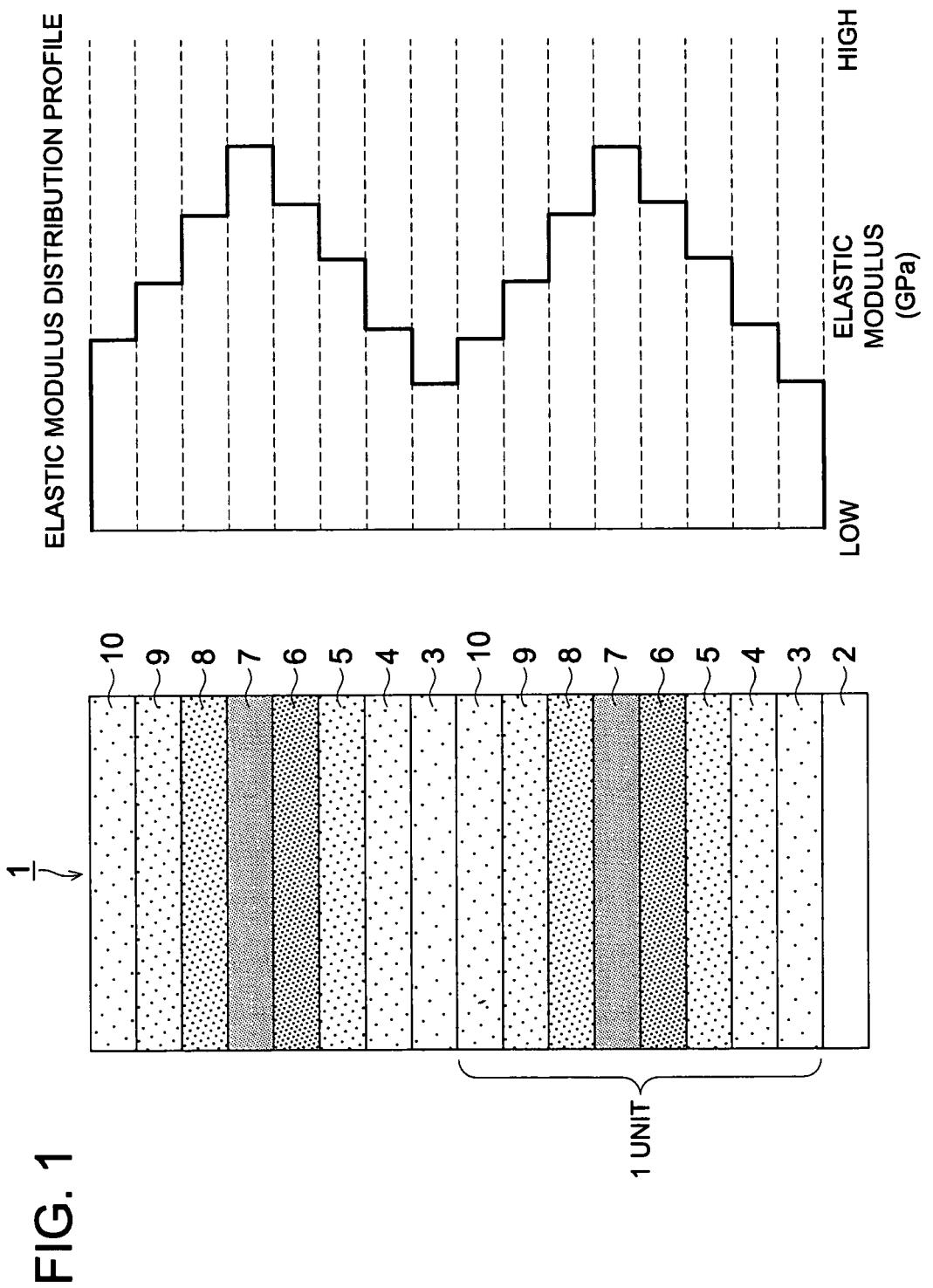
FIG. 1 is a pattern diagram showing an example of the layer composition of a gas barrier film of the present invention and the elastic modulus distribution profile thereof.

10: Plasma discharge treatment device
11: First electrode
12: Second electrode
21: First power source
22: Second power source
30: Plasma discharge treatment space
35: Roller electrode
36: Electrode
41, 42: Power source
51: Gas generating apparatus
F: Substrate

DESCRIPTION OF THE PREFERRED EMBODIMENTS

The following is a detailed description of the most preferable embodiment for practicing the present invention.

As a result of diligent studies in view of the problems described above, the inventors found out that it is necessary to form an interface not to propagate a breaking vibration among constitution layers when it is subjected to hard mechanical impact, however, adhesion property deteriorates at an interface when an interface is formed by layers having so much different properties. A transparent gas barrier film with excellent adhesion even when it is stored under severe condition, furthermore without deterioration when it is subjected to hard mechanical impact, favorable transparency and gas barrier resistance is realized by a transparent gas barrier film in which two or more layers having different density each other wherein a difference of elastic modulus of adjacent layers is not less than 1 GPa and not more than 10 GPa and a thickness of not less than 1 nm and not more than 10 nm.

Furthermore, in addition to the specification above, it was discovered that the advantage of the present invention were demonstrated even more when:

the layers in which an elastic modulus gradually increases from low elastic modulus layer to high elastic modulus layer;

the layers in which an elastic modulus gradually decreases from high elastic modulus layer to low elastic modulus layer;

the layer having the highest elastic modulus comprises the ceramic layer comprising at least one compound selected from the group consisting of silicon oxide, silicon nitride, silicon oxide nitride and aluminum oxide; and further a density ratio Y $(=\rho f/\rho b)$ is $1 \geq Y > 0.95$ and a residual stress of the ceramic layer is not less than 0.01 MPa and not more than 10 MPa, wherein $\rho f$ is a density of the ceramic layer and $\rho b$ is a density of a thermal oxide layer or thermal nitride layer formed by thermally oxidation or thermally nitridation of a metal of the base material of the ceramic layer.

The density of each of the component layers stipulated in the present invention values determined by the X-ray reflectance method are used, though it can be determined by using the known analytic means.

An outline of the X-ray reflectance method in X-ray diffraction Handbook, Page 151 (edited by Rigaku Denki Corporation 2000, Published by Kokusai Bunken Insatsu Sha) or Chemical Industries, January 1999 No. 22 can be referred to perform the method.

The following is a specific example of the method for measurement useful in the present invention.

The measurement is carried out by entering X-ray on the material having smooth surface at very low incident angle. MXP21 manufactured by Mac Science Co., Ltd. is used as the measuring device. The device is operated at 42 kV and 500 mA using copper as the X-ray light source. A multilayer parabola mirror is used as the incident monochrometor. An incidence slit of 0.05 mm×5 mm and a light receiving slit of 0.03 mm×20 mm is used. Measurements are done using the FT method having $2\theta/\theta$ mode from 0 degree to 5 degrees with step size of 0.005 degrees and scanning speed of 10 seconds per step. Curve fitting is performed using the Reflectivity Analysis Program Ver. 1 manufactured by Mac Science Co., Ltd. for the obtained by the reflectance curve, and the parameters are determined such that the residual sum of squares of the measured value and the fitting curve is a minimum. The thickness and density of the laminated layer can be obtained from the parameters. The layer thickness evaluation of the laminated layer in the present invention can also be determined by the X-ray reflectance measurements described above.

This method can be used, for example, to measure the density ($\rho f$) of the ceramic film made of silicon oxide, silicon nitride and silicon oxide nitride formed by the atmospheric pressure plasma method (to be described later) or atmospheric pressure vapor deposition method.

The aforementioned ceramic film having maximum elastic modulus is required to be compact and is preferably kept within the aforementioned range in terms of the density ratio $Y (=\rho f/\rho b)$ which is the ratio of the bulk to be the composition with respect to the density ($\rho b$) of the ceramic (silicon oxide of the bulk when the ceramic film to be formed is a silicon oxide film). This preferably provides the degree of compactness which is close to that of the bulk. The method to produce the aforementioned film stably is preferable.

The density of the ceramic film formed by thermal oxidation or thermal nitriding of the base material of the ceramic film formed by vapor deposition or plasma CVD so as to have the same percentage composition as that of the ceramic film as a gas barrier film formed on the resin film is used for the aforementioned bulk film. The base material, namely, the silicon substrate is used as the base material in the case of the silicon oxide.

Formation of the silicon oxide film by thermal oxidation of silicon substrate is widely known. A thermally oxidized film is formed on the surface of the silicon substrate, for example, at 800°. The property of the silicon oxide film has been much studied in the field of semiconductors. In the silicon oxide film, an approximately 1 nm-thick transitory layer having a structure different from that of the bulk silicon oxide is known to be present close to the boundary of the silicon substrate. Thus, the silicon oxide bulk film of a sufficient thickness (for example 10 nm-300 nm) is formed in order to avoid adverse effect of this portion. Further, in case of silicon oxide film, an oxide film having thin boundary is formed by exposure to ozone atmosphere, for example, at low temperature. These methods may also be used.

The aforementioned statement also applies to the oxide nitrided film and nitrided film. The ceramic film is formed from the base material, for example, a metallic substance by thermal oxynitriding or nitriding by adjusting such conditions as the type and flow rate of gas, temperature and time. The density ($\rho b$) of the bulk is measured according to the aforementioned X-ray reflectivity method.

For example, when the resin film having a ceramic film formed is left to stand under predetermined conditions, a positive curl and negative curl occur due to the relationship of film quality between the substrate film and ceramic film. This curl is produced by the stress occurring in the ceramic film. The greater the amount of curl (positive), the greater will be the compressive stress.

The following method is utilized to measure the internal stress of the ceramic film.

A ceramic film having the same composition and thickness as those of the film to be measured is formed on a quartz substrate having a width of 10 mm, a length of 50 mm and thickness of 0.1 mm according to the same procedure. The curl occurring to the sample having been produced is measured by a thin film evaluation device, Model MH4000 manufactured by NEC Sanei Co., Ltd., with the concave portion of the sample facing upward. Generally, the stress is said to be positive when the positive curl wherein the film side is contracted with respect to the substrate by the compressive stress. Conversely, when a negative curl is produced by the tensile stress, the stress is said to be negative.

In the present invention, the stress value is preferably 0.01 MPa or more without exceeding 10 MPa.

The present invention will be described in details as below.

The transparent gas barrier film of the present invention is featured by comprising a resin substrate having thereon at least two layers having different elastic modulus, wherein the elastic modulus difference between adjacent layers is 1 GPa or more and 10 GPa or less, and each layer has a thickness of 1 nm or more and 10 nm or less.

The elastic modulus of the invention can be measured by well-known measurement method of elastic modulus, for example, measuring by applying a constant strain under a constant frequency (Hz) by using Vibron DDV-2 manufactured by Orientec Co. Ltd., method by value obtained from changing applied strain under a constant frequency by using RSA-II manufactured by Rheometric Scientific after forming a layer on the transparent substrate, or nano indenter using nano indentation method such as Nano Indenter TMXP/DCM manufactured by MTS Systems Corporation. In the case of a very thin film like the present invention, nano indentation method is preferably used, from the stand point of high accurate measurement for elastic modulus of the layer.

A nano indentation method is a method of calculating elastic modulus (Reduced modulus) by the following procedure:

pushing a triangular tip shape indenter having 0.1-1 µm of the tip radius by a very small load into a thin film provided on the transparent substrate as the measuring object;

unloading by carrying back the indenter;

plotting a load-displacement curve; and calculating modulus from the relationship between the value of load and push-in depth obtained by the load-displacement curve. The amount of displacement resolution can be measured to an accuracy of 0.01 nm by this nano indentation method, while employing a head assembly having a very low load such as maximum 20 mN and load resolution in 1 nN.

Further, the elastic modulus of each layer in the laminated layers can be measured by pushing a very small triangular tip shape indenter from a cross-sectional surface. When a nano indenter which can be operated in the scanning microscope (SA2000N manufactured by US Gatan, Inc.) is employed so as to improve the accuracy, an layer having graded structure of the elastic modulus can be measured as well as a cross-sectional surface.

In the transparent gas barrier film of the present invention, it is preferable that a low elastic modulus layer is provided on the resin substrate, layers are laminated so as to increase elastic modulus in steps and then to decrease elastic modulus in steps. When a constitution which comprise unit A and unit B is considered to be one composite unit, the unit A and the unit B are preferably repeatedly laminated twice or more, wherein the layer unit A exhibits a graded structure from lower elastic modulus layer to a high elastic modulus layer and the layer unit B exhibits a graded structure from a high elastic modulus layer to a low elastic modulus layer.

FIG. 1 is a schematic view of a pattern diagram showing an example of the layer composition of a gas barrier film of the present invention and the elastic modulus distribution profile thereof.

The transparent gas barrier film 1 of the present invention comprises the substrate 2 having thereon at least two layers having different elastic modulus. In the present invention, layer 4, layer 5 and layer 6 are laminated on low elastic modulus layer 3 as layers having increased elastic modulus in steps; layer 7 having the maximum elastic modulus is laminated thereon; and further layer 8, layer 9 and layer 10 are laminated on the maximum elastic modulus layer 7 as layers having decreased elastic modulus in steps. FIG. 1 shows the example of the layers having laminated two units, wherein one unit comprises a constitution from low elastic modulus layer 3 to layer 10. The distribution of the elastic modulus in each layer is uniform and the elastic modulus difference between adjacent layers exhibits a graded structure in steps. In FIG. 1, one composed unit comprise eight laminated layers, however if necessary, a constitution having more or less layers may be used.

The method for controlling the elastic modulus difference between the layers to the desired conditions shown in FIG. 1 is not particularly limited, but in the layer formation of the atmospheric plasma method described hereinafter that is preferably applied in the present invention, the layer is obtained by suitably selecting a method, namely, the type and supply amount of a layer forming material or the output condition of electric power at the time of plasma discharge is suitably selected in the gas barrier film of the present invention. Among the above it is preferable to control a supply amount of a layer forming material, i.e., layer forming rate; A low elastic modulus layer is formed when the layer forming rate is high and a high density layer is formed when the layer forming rate is low.

Composing elements of the transparent barrier film of the present invention are described.

<Gas Barrier Layer>

First, the component elements of the transparent gas barrier film of the present invention will be described.

The constitution of the gas barrier layer of the present invention is not particularly limited provided that permeation of oxygen and water vapor is blocked. The material for forming the gas barrier layer is preferably ceramics, and specific examples of the material include silicon oxide, silicon nitride, aluminum oxide, silicon oxide nitride, aluminum oxide nitride, magnesium oxide, zinc oxide, indium oxide, and tin oxide. The whole thickness of the gas barrier layer constituted two or more layers in the present invention varies and is suitably selected in accordance with the type of material used and optimal conditions for the constitution, but it is preferably in the range of 5 to 2,000 nm. When the thickness of the gas barrier is less than the above range, an even layer cannot be obtained and is difficult to obtain gas barrier properties. In addition, thickness of the gas barrier is greater than the above range, it is difficult to maintain flexibility of the gas barrier film and there is the possibility that cracks and the like may occur in the gas barrier film due to external factors such as bending and pulling after layer formation.

The gas barrier layer of the present invention may be formed by subjecting the material described below to the spraying method, spin coating method, sputtering method, ion assist method, plasma CVD method described hereinafter, or the plasma CVD method under atmospheric pressure or approximately atmospheric pressure.

However, in wet methods such as the spray method and the spin coating methods, obtaining molecular level (nm level) smoothness is difficult, and because a solvent is used, and the substrate which is described hereinafter is an organic material, there is the shortcoming that materials or solvents that can be used are limited. Thus, in the present invention, a layer that is formed using the plasma CVD method or the like is preferable, and the atmospheric plasma CVD method in particular is preferable in view that a reduced pressure chamber and the like is unnecessary, high speed layer formation becomes possible, and it is a high productivity layer formation method. By forming the transparent gas barrier layer using the atmospheric plasma CVD method, it becomes possible to form a layer which is even and has surface smoothness relatively easily.

The conditions for layer formation by the plasma CVD method and the plasma CVD method under atmospheric pressure or approximately atmospheric pressure is described in detail hereinafter.

It is preferable that the gas barrier layer is obtained by using the plasma CVD method or the plasma CVD method performed under atmospheric pressure or near atmospheric pressure because a metal carbide, metal nitride, metal oxide, metal sulfide, metal halide and their mixture thereof (such as metal oxide-nitride, metal oxide-halide, and metal nitride-carbide) can be optionally produced by selecting an organo-metal compound as the raw material, decomposition gas, decomposition temperature and applying electric power.

For example, silicon oxide is formed by using a silicon compound as the raw material and oxygen as the decomposition gas, and zinc sulfide is formed by using a zinc compound as the raw material and carbon disulfide as the decomposition gas. In the space of plasma, very high actively charged particles or active radicals exist in high density. Therefore, plural steps of chemical reaction are accelerated in very high rate in the plasma space and the elements being in the plasma space is converted to the chemically stable compound within extremely short duration.

The state of the inorganic raw material may be gas, liquid or solid at room temperature as far as the raw material contains a typical metal element or a transition metal element. The gas can be directly introduced into the discharging space and the liquid or solid is used after vaporized by a method such as heating bubbling or applying ultrasonic wave. The raw material may be used after diluted by a solvent. An organic solvent such as methanol, ethanol, n-hexane and a mixture thereof can be used for such the solvent. The influence of the solvent can be almost ignored because the solvent is decomposed into molecular or atomic state by the plasma discharge treatment.

Examples of such the organic compound include a silicon compound such as silane, tetramethoxysilane, tetraethoxysilane, tetra-n-propoxysilane, tetra-iso-propoxysilane, tetra-n-butoxysilane, tetra-t-butoxysilane, dimethyldimethoxysilane, dimethyldiethoxysilane, diethyldimethoxysilane, diphenyldimethoxysilane, methyltriethoxysilane, ethyltrimethoxysilane, phenyltriethoxysilane, (3,3,3-trifluoropropyl)trimethoxysilane, hexamethyldisiloxane, bis(dimethylamino)dimethylsilane, bis(dimethylamino)methylvinylsilane, bis(ethylamino)dimethylsilane, N,O-bis(trimethylsilyl)acetamide, bis(trimethylsilyl)carbodiimide, diethylaminotrimethylsilane, dimethylaminodimethylsilane, hexamethyldisilazane, heaxamethylcyclotrisilazane, heptamethylsilazane, nonamethyltrisilazane, octamethylcyclotetrasilazane, tetrakis dimethylaminosilazane, tetraisocyanatesilane, tetramethyldisilazane, tris(dimethylamino)silane, triethoxyfluorosilane, allyldimethylsilane, allyltrimethylsilane, benzyltrimethylsilane, bis(trimethylsilyl)acetylene, 1,4-bistrimethylsilyl-1,3-butadiine, di-t-butylsilane, 1,3-disilabutane, bis(trimethylsilyl)methane, cyclopentadienyltrimethylsilane, phenyldimethylsilane, phenyltrimethylsilane, propagyltrimethylsilane, tetramethylsilane, trimethylsilylacetylene, 1-(trimethylsilyl)-1-propine, tris(trimethylsilyl)methane, tris(trimethylsilyl)silane, vinyltrimethylsilane, hexamethyldisilane, octamethylcyclotetrasiloxane, tetramethylcyclotetrasiloxane, hexamethylcyclotetrasiloxane and M-silicate 51.

Examples of the titanium compound include titanium methoxide, titanium ethoxide, titanium isopropoxide, titanium tetraisopropoxide, titanium n-butoxide, titanium isopropoxide(bis-2,4-pentanedionate), titanium diisopropoxide(bis-2,4-ethylacetoacetate), titanium di-n-butoxide(bis-2,4-pentanedionate), titanium acetylacetonate and butyl titanate dimer.

Examples of the zirconium compound include zirconium n-propoxide, zirconium n-butoxide, zirconium t-butoxide, zirconium tri-n-butoxide acetylacetonate, zirconium di-n-butoxide bisacetylacetonate, zirconium acetylacetonate, zirconium acetate and zirconium hexafluoropentanedionate.

Examples of the aluminum compound include aluminum ethoxide, aluminum triisopropoxide, aluminum isopropoxide, aluminum n-butoxide, aluminum s-butoxide, aluminum t-butoxide, aluminum acetylacetonate and triethyldialuminum tri-s-butoxide.

Examples of the boron compound include diborane, tetraborane, boron fluoride, boron chloride, boron bromide, borane-diethyl ether complex, borane-THF complex, borane-dimethyl sulfide complex, borane trifluoro-diethyl ether complex, triethylborane, trimethoxyborane, triethoxyborane, tri(isopropoxy)borane, borazol, trimethylborazol, triethylborazol and triisopropylborazol.

Examples of the tin compound include teraethyltin, tetramethyltin, diaceto-di-n-butyltin, terabutyltin, tetraoctyltin, tetraethoxytin, methyltriethoxytin, diethyldiethoxytin, triisopropylethoxytin, diethyltin, dimethyltin, diisopropyltin, dibutyltin, diethoxytin, dimethoxtin, diisopropoxytin, dibutoxytin, tin dibutylate, tin diacetoacetonate, ethyltin acetoacetonate, ethoxytin acetoacetonate, dimethyltin diacetoacetonate, tin hydride and tin halide such as tin dichloride and tin tetrachloride.

Examples of another organic metal compound include antimony ethoxide, arsenic triethoxide, barium 2,2,6,6-tetramethylheptanedionate, beryllium acetylacetonate, bismuth hexafluoropentanedionate, dimethylcadmium, calcium 2,2,6,6-tetramethylheptanedionate, chromium trifluoropentanedionate, cobalt acetylacetonate, copper hexafluoropentanedionate, magnesium heaxfluoropentane-dionate dimethylether complex, gallium ethoxide, tetraethoxygermanium, tetramethoxygermanium, hafnium t-butoxide, hafnium ethoxide, indium acetylacetonate, indium 2,6-dimethylamino-heptanedionate, ferrocene, lanthanum isopropoxide, lead acetate, tetraethyllead, neodium acetylacetonate, platinum hexafluoropentanedionate, trimethylcyclopentanedienylplatinum, rhodium dicarbonylacetylacetonate, strontium 2,2,6,6-tetramethylheptanedionate, tantalum methoxide, tantalum trifluoroethoxide, tellurium ethoxide, tungsten ethoxide, vanadium triisopropoxideoxide, magnesium hexafluoroacetylacetonate, zinc acetylacetonate and diethylzinc.

Examples of the decomposition gas for decomposing the raw material gas containing the metal to form an inorganic compound include hydrogen gas, methane gas, acetylene gas, carbon monoxide gas, carbon dioxide gas, nitrogen gas, ammonium gas, nitrogen suboxide gas, nitrogen oxide gas, nitrogen dioxide gas, oxygen gas, steam, fluorine gas, hydrogen fluoride, trifluoroalcohol, trifluorotoluene, hydrogen sulfide, sulfur dioxide, carbon disulfide and chlorine gas.

Various kinds of metal carbide, metal nitride, metal oxide, metal halide and metal sulfide can be obtained by suitably selecting the metal element-containing raw material gas and the decomposition gas.

Such the reactive gas is mixed with a discharging gas capable of easily becoming into a plasma state and sent into the plasma discharge generation apparatus. Nitrogen gas and/or an atom of Group 18 of periodic table such as helium, neon, argon, krypton, xenon and radon are used for such the discharging gas. Of these, nitrogen, helium and argon are preferably used.

The discharging gas and the reactive gas are mixed to prepare a mixed gas and supplied into the plasma discharge (plasma generating) apparatus to form the layer. The reactive gas is supplied in a ratio of the discharging gas to whole mixture of the gases of 50% or more although the ratio is varied depending on the properties of the layer to be formed.

In the gas barrier layer of the present invention, the organic compound included in the gas barrier is preferably SiOx, SiNy, or SiOxNy (x=1-2, y=0.1-1), and $SiO_x$ is preferable in view of the transmission of water content, the transmission of light rays, and the suitability of atmospheric plasma CVD.

The inorganic compound of the present invention, for example $SiO_x$, $SiN_y$ or $SiO_xN_y$, may be combined with the above organic silicon compound as well as oxygen gas or nitrogen gas in a prescribed proportion, and a layer including at least one of O atoms and the N atoms and Si atoms can be obtained. In the gas barrier layer of the present invention, the light ray transmission T is preferably 80% or more.

<<Layers Having Elastic Modulus Difference>>

Layers having elastic modulus according to present invention are described.

The constitution layers having an elastic modulus difference of the present invention may include the above described barrier layer or may be provided under or over it, and their composition and so on are not particularly limited provided that they satisfy the elastic modulus difference and thickness. The material for forming constitution layers having an elastic modulus difference is preferably ceramics and specific examples of the material include silicon oxide, silicon nitride, aluminum oxide, silicon oxide nitride, aluminum oxide nitride, magnesium oxide, zinc oxide, indium oxide, and tin oxide. It is more preferable that constitution layers having an elastic modulus difference of the present invention have elastic modulus lower than that of the highest elastic modulus layer and have elastic modulus difference between the adjacent layers of not less than 1 GPa and not more than 20 GPa, thickness of 1 nm or more and not more than 10 nm, and more preferably are composed of two or more layers.

The constitution layers having an elastic modulus difference of the present invention may be formed by subjecting the material described below to the spraying method, spin coating method, sputtering method, ion assist method, plasma CVD method described hereinafter, or the plasma CVD method under atmospheric pressure or approximately atmospheric pressure.

However, in wet methods such as the spray method and the spin coating methods, obtaining molecular level (nm level) smoothness is difficult, and because a solvent is used, and the substrate which is described hereinafter is an organic material, there is the shortcoming that materials or solvents that can be used are limited. Thus, in the present invention, a layer that is formed using the plasma CVD method or the like is preferable, and the atmospheric plasma CVD method in particular is preferable in view that a reduced pressure chamber and the like is unnecessary, high speed layer formation becomes possible, and it is a high productivity layer formation method. By forming the layers having an elastic modulus difference described above using the atmospheric plasma CVD method, it becomes possible to form a layer which is even and has surface smoothness relatively easily. Further when that the plasma CVD method under atmospheric pressure or approximately atmospheric pressure is used for preparation of Gas Barrier Layer, there is advantage to have extremely high productivity by successive continuous process. It is particularly preferable that the plasma CVD method under atmospheric pressure or approximately atmospheric pressure is used. The layer formation conditions in the plasma CVD method is described later.

It is preferable that the layers having an elastic modulus difference are obtained by using the plasma CVD method or the plasma CVD method performed under atmospheric pressure or near atmospheric pressure because a metal carbide, metal nitride, metal oxide, metal sulfide, metal halide and their mixture thereof (such as metal oxide-nitride, metal oxide-halide, and metal nitride-carbide) can be optionally produced by selecting an organometallic compound as the raw material, decomposition gas, decomposition temperature and applying electric power.

The state of the inorganic raw material may be gas, liquid or solid at room temperature as far as the raw material contains a typical metal element or a transition metal element. The gas can be directly introduced into the discharging space and the liquid or solid is used after vaporized by a method such as heating bubbling or applying ultrasonic wave. The raw material may be used after diluted by a solvent. An organic solvent such as methanol, ethanol, n-hexane and a mixture thereof can be used for such the solvent. The influence of the solvent can be almost ignored because the solvent is decomposed into molecular or atomic state by the plasma discharge treatment.

Examples of an organometallic compound which is used for forming the gas barrier layer above include silicon compound, titanium compound, zirconium compound, aluminum compound, boron compound, tin compound and another organometallic compound.

Examples of the decomposition gas for decomposing the raw material gas containing the metal to form an inorganic compound include the same gases described above.

Various kinds of metal carbide, metal nitride, metal oxide, metal halide and metal sulfide can be obtained by suitably selecting the metal element-containing raw material gas and the decomposition gas.

Such the reactive gas is mixed with a discharging gas capable of easily becoming into a plasma state and sent into the plasma discharge generation apparatus. Nitrogen gas and/or an atom of Group 18 of periodic table such as helium, neon, argon, krypton, xenon and radon are used for such the discharging gas. Of these, nitrogen, helium and argon are preferably used.

The reactive gas is supplied in a ratio of the discharging gas to whole mixture of the gases of 50% or more although the ratio is varied depending on the properties of the layer to be formed.

In the constitution layers having an elastic modulus difference of the present invention, the organic compound containing the same atoms as the gas barrier having lower elastic modulus than the gas barrier layer is preferably employed.

<Substrate>

The substrate used in the transparent gas barrier film of the present invention is not particularly limited provided it is a layer that is formed of an organic material that can hold the gas barrier layer that has the barrier properties.

Specific examples of the films which may be used are as follows. Homopolymers such as ethylene, polypropylene, butene, or copolymers or polyolefin (PO) resins such as copolymers; amorphous polyolefin resins (APO) such as cyclic polyolefins; polyester resins such as polyethylene terephthalate (PET) and polyethylene 2,6-naphthalate (PEN); polyamide (PA) resins such as nylon 6, nylon 12 and copolymer nylon; polyvinyl alcohol resins such as polyvinyl alcohol (PVA) resins and ethylenevinyl alcohol copolymers (EVOH); polyimide (PI) resins; polyether imide (PEI) resins; polysulfone (PS) resins; polyether sulfone (PES) resins; polyether ether ketone (PEEK) resins; polycarbonate (PC) resins; polyvinyl butyrate (PVB) resins; polyarylate (PAR) resins; fluorine resins such as ethylene-tetrafluoroethylene copolymers (ETFE), ethylene trifluorochloride (PFA), ethylene tetrafluoride-perfluoroalkyl vinyl ether copolymers (FEP), vinylidene fluoride (PVDF), vinyl fluoride (PVF), and perfluoroethylene-perfluoropropylene-perfluorovinyl ether copolymers (EPA).

Also, besides the above resins, photocurable resins such as resin compositions comprising an acrylate compound having a radical reactive unsaturated compound, resin compositions including the acrylate compound and a mercapto compound having a thiol group and resin compositions obtained by dissolving oligomers such as epoxyacrylate, urethaneacrylate, polyesteracrylate, or polyether acrylate in a polyfunctional acrylate monomer or mixtures of these resins may be used. Furthermore, laminates obtained by laminating one or two or more of these resins by means of laminating or coating may be used as the substrate film.

These materials may be used singly or may be suitably mixed. Of these, commercially available products such as ZEONEX or ZEONOR (manufactured by Nippon Zeon), ARTON which is an amorphous cyclopolyolefein resin film (manufactured by JSR), PURE ACE which is polycarbonate film (manufactured by Teijin), KONICA TAC KC4UX and KC8UX which are cellulose triacetate films (manufactured by Konica Minolta Opto) may be suitably used.

The substrate is preferably transparent. When the substrate and the layer formed on the substrate is also transparent, it becomes possible for the gas barrier film to be transparent, and thus it can be used for transparent substrates such as organic EL elements.

The substrate of the present invention using the resin listed above may be either an unstretched film or a stretched film.

The substrate according to the present invention may be produced using a conventionally known usual method. For example, a resin as the raw material is melted using an extruder, extruded using a cyclic die or T-die and cooled quickly, and thus an unstretched substrate which is substantially amorphous and non-oriented can be produced. Also, an unstretched substrate is stretched in the direction of the flow (vertical axis) of the substrate or in the direction perpendicular (horizontal axis) to the direction of the flow of the substrate by using a known method such as uniaxial orientation, tenter-type sequential biaxial stretching, tenter-type simultaneous biaxial stretching, or tubular-type simultaneous biaxial stretching, and thus a stretched substrate can be produced. The magnification of stretching in this case is preferably 2 to 10 in both of the vertical axis direction and the horizontal axis direction, buy it may be suitably selected to correspond with a resin as the raw material of the substrate.

Also, the substrate according to the present invention may be processed by surface treatment such as corona treatment, flame treatment, plasma treatment, glow discharge treatment, surface roughing treatment, or chemical treatment.

Further, an anchor coating-agent layer may be formed on the surface of the substrate according to the present invention with the purpose of improving adhesion to the vacuum deposition layer. Examples of anchor coating agent to be used in the anchor coating-agent layer include a polyester resin, isocyanate resin, urethane resin, acryl resin, ethylenevinyl alcohol resin, denatured vinyl resin, epoxy resin, denatured styrene resin, denatured silicon resin, and alkyl titanate, and these may be used either singly or in combinations of two or more. Conventionally known additives may be added to the anchor coating agents. The substrate may be coated with the above anchor coating agent by using a known method such as roll coating, gravure coating, knife coating, dip coating, or spray coating and the solvents or diluents are removed by drying, and thus anchor coating can be carried out. The amount of the above anchor coating agent to be applied is preferably about 0.1 to 5 g/m$^2$ (dry condition).

A long product which is wound to be roll-like is convenient as the substrate cannot be generally specified because it differs depending on uses of the obtained gas barrier film, and the thickness of the substrate is not particularly limited when the gas barrier film is used for packaging. However, based on suitability for packaging material, it is preferably in the range of 3 to 400 μm, and more preferably 6 to 30 μm.

In the addition, the substrate used in the present invention is preferably a layer having a thickness of 10 to 200 μm and more preferably 50 to 100 μm.

Also, the water vapor transmission rate for the gas barrier film of the present invention is preferably 1.0 g/m$^2$/day or less when measured by the JIS K7129 B method, when used for applications which require a high degree of water vapor barrier properties such as organic EL displays and high resolution color liquid crystal displays. Furthermore, in the case where the gas barrier film is used for organic EL displays, even if almost negligible, dark spot which grow are generated, and the life of the display is sometimes is shortened to a great extent and thus the water vapor transmission rate of the gas barrier film is preferably less than 0.1 g/m$^2$/day.

<<Plasma CVD Method>>

Next, the plasma CVD method and the plasma CVD method under atmospheric pressure, which can be preferably employed to form the low density layer, the intermediate density layer and the high density layer of the present invention in the production method of the transparent gas barrier film of the present invention will be explained further in detail.

The plasma CVD method of the present invention will now be explained.

The plasma CVD method is also called as plasma enhanced chemical vapor deposition method or PECVD method, by which a layer of various inorganic substances having high covering and contact ability can be formed on any solid-shaped body without excessively raising the temperature of the substrate.

The usual CVD method (chemical vapor deposition method) is a method in which the evaporated or sublimated organic metal compound is stuck onto the surface of the substrate at high temperature and thermally decomposed to form a thin layer of a thermally stable inorganic substance. Such the usual CVD method (also referred to as a thermal CVD method) cannot be applied for layer forming on the plastic substrate since the substrate temperature is not less than 500° C.

In the plasma CVD method, a space in which gas is in the plasma state (a plasma space) is generated by applying voltage in the space near the substrate. Evaporated or sublimated organometal compound is introduced into the plasma space and decomposed, followed by being blown onto the substrate to form a thin layer of inorganic substance. In the plasma space, the gas of a high ratio of several percent is ionized into ions and electrons, and the electron temperature is very high while the gas is held at low temperature. Accordingly, the organometal compound which is the raw material of the inorganic layer can be decomposed by contacting with the high temperature electrons and the low temperature but excited state of ion radicals. Therefore, the temperature of the substrate on which the inorganic layer is formed can be kept low, and thus the layer can be sufficiently formed even on a plastic substrate.

However, since it is necessary to apply an electric field to the gas for ionizing the gas into the plasma state, the film has usually been produced in a space reduced in the pressure of from about 0.101 kPa to 10.1 kPa. Accordingly the plasma CVD equipment has been large and the operation has been complex, resulting in suffering from a problem of productivity.

In the plasma CVD method under near atmospheric pressure, not only the reduced pressure is not necessary, resulting in a high productivity, but also a high layer forming rate is obtained since the density of the plasma is higher. Further a notably flat film compared to that obtained via usual plasma CVD method is obtained, since mean free path of the gas is considerably short under the high pressure condition namely an atmospheric pressure. Thus obtained flat film is preferable with respect to the optical property or the gas barrier property. As described above, in the present invention, the plasma CVD method under near atmospheric pressure is more preferable than the plasma CVD method under vacuum.

The apparatus for forming the gas barrier layer by the plasma CVD method under the atmospheric pressure or near atmospheric pressure is described in detail below.

An example of the plasma layer forming apparatus to be used in the gas barrier material producing method of the present invention for forming the transparent gas barrier layer and the layers having different elastic modulus is described referring FIGS. 2 to 5. In the drawings, F is a long length film as an example of the substrate.

Figure 2:
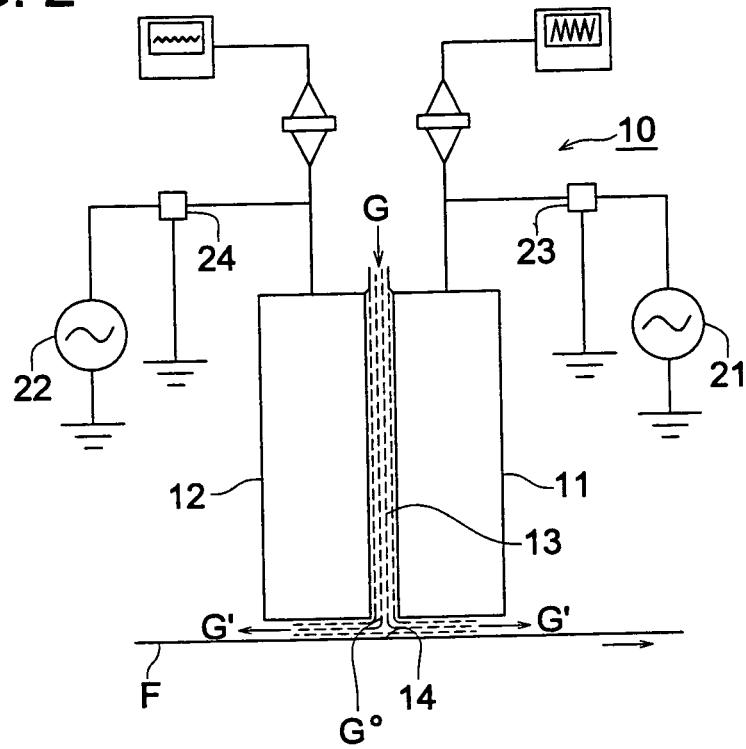
FIG. 2 is a schematic view showing an example of the jet type atmospheric plasma discharge treatment device useful in the present invention.

FIG. 2 is a schematic drawing of an example of an atmospheric pressure plasma discharge apparatus by jet system available for the present invention.

The jet system atmospheric pressure discharge apparatus is an apparatus having a gas supplying means and an electrode temperature controlling means, which are not described in FIG. 2 (shown in FIG. 3 later), additionally to a plasma discharge apparatus and an electric field applying means with two electric power sources.

A plasma discharge apparatus 10 has facing electrodes constituted by a first electrode 11 and a second electrode 12. Between the facing electrodes, first high frequency electric field with frequency of $\omega_1$, electric field strength of $V_1$ and electric current of $I_1$ supplied by the first power source 21 is applied by the first electrode 11 and second high frequency electric field with frequency of $\omega_2$, electric field strength of $V_2$ and electric current of $I_2$ supplied by the second power source 32 is applied by the second electrode 12. The first power source 21 can supply high frequency electric field strength higher than that by the second power source 22 ($V_1 > V_2$) and the first power source 21 can supply frequency $\omega_1$ lower than the frequency $\omega_2$ supplied by the second power source 22.

A first filter 23 is provided between the first electrode 11 and the first power source 12 so that the electric current from the first power source 21 is easily passed to the first electrode 11 and the current from the second power source 22 is difficultly passed to the first electrode 11 by grounding the current from the second power source 22 to the first power source 21.

A second filter 24 is provided between the first electrode 12 and the first power source 22 so that the electric current from the second power source 22 is easily passed to the second electrode and the current from the first power source 21 is difficultly passed to the second electrode by grounding the current from the first power source 21 to the second power source.

Figure 4:
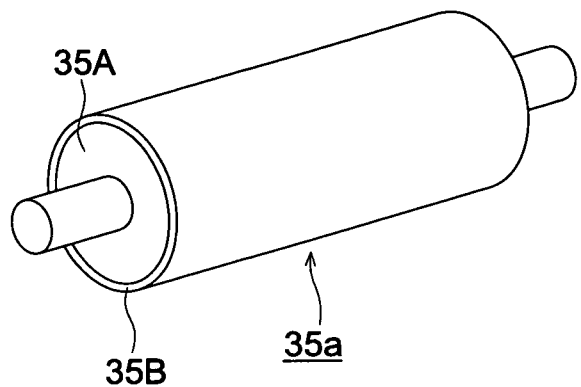
FIG. 4 is a perspective view showing an example of the conductive base metal for the rotatable roll electrodes and the dielectric structure that covers the base metal.

Gas G is introduced from a gas supplying means such as that shown in FIG. 4 into the space (discharging space) between the facing first electrode 11 and the second electrode 12, and discharge is generated by applying high frequency electric field from the first and second electrodes so as to make the gas to plasma state and the gas in the plasma state is jetted to the under side (under side of the paper if the drawing) of the facing electrodes so as to fill the treatment space constituted by under surfaces of the facing electrodes and the substrate F by the gas in the plasma state, and then the thin layer is formed near the treatment position 14 on the substrate F conveyed from the bulk roll (unwinder) of the substrate by unwinding or from the previous process. During the layer formation, the electrodes are heated or cooled by a medium supplied from the electrode temperature controlling means shown in FIG. 4 which will be mentioned later trough the pipe. It is preferable to suitably control the temperature of the electrodes because the physical properties and the composition are varied sometimes according to the temperature of the substrate on the occasion of the plasma discharge treatment. As the medium for temperature control, an insulation material such as distilled water and oil is preferably used. It is desired that the temperature at the interior of the electrode is uniformly controlled so that non-uniformity of temperature in the width direction and length direction of the substrate is made as small as possible on the occasion of the plasma discharge treatment.

A plurality of the atmospheric pressure plasma discharge treating apparatus by the jetting system can be directly arranged in series for discharging the same gas in plasma state at the same time. Therefore, the treatment can be carried out plural times at high rate. Furthermore, a multilayer composed of different layers can be formed at once by jetting different gases in plasma state at the different apparatuses, respectively.

Figure 3:
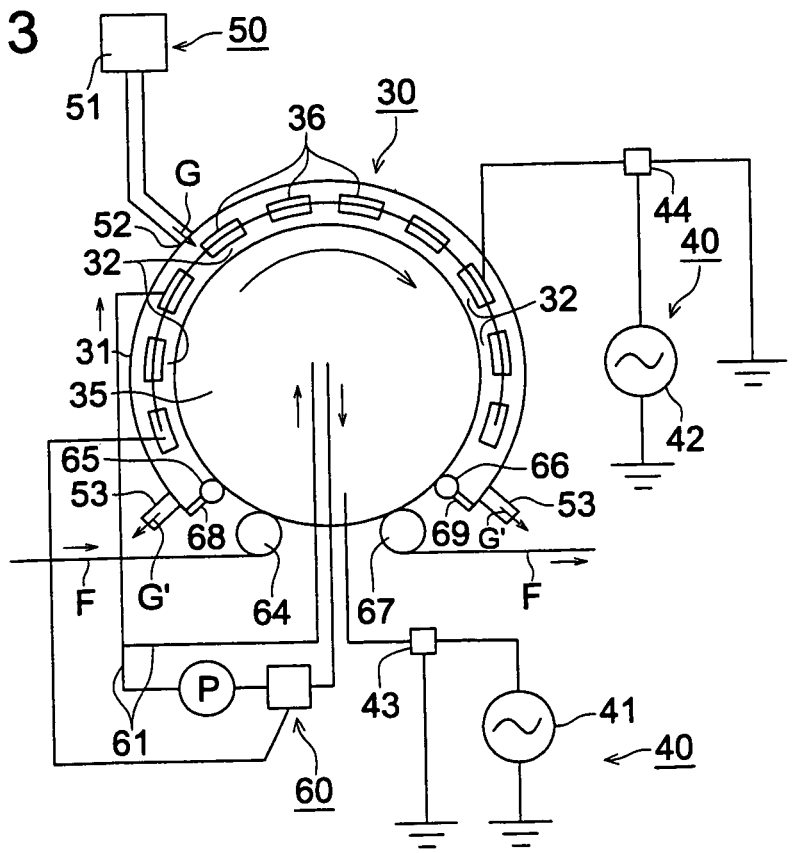
FIG. 3 is a schematic view showing an example of the type of atmospheric plasma discharge treatment device which processes substrate between facing electrodes that is useful in the present invention.

FIG. 3 is a schematic drawing of an example of the atmospheric pressure discharge apparatus for treating the substrate between the facing electrodes effectively applied for the present invention.

The atmospheric pressure plasma discharge apparatus of the present invention at least has a plasma discharge apparatus 30, an electric field applying means having two electric power sources 40, a gas supplying means 50 and an electrode temperature controlling means 60.

In the apparatus shown in FIG. 3, a thin layer is formed by the plasma discharge treatment carried out on the substrate F in a charge space 32 constituted between a rotatable roller electrode (first electrode) 35 and a group of square tube-shaped electrodes (second electrode) 36. In FIG. 3, an electric field is formed by a pair of square tube-shaped electrodes (second electrode) 36 and a rotatable roller electrode (first electrode) 35, and using this unit, for example, a low density layer is formed. FIG. 4 illustrates an example including five such units, and, by independently controlling, for example, the supplying raw material and output voltage in each unit, the laminating type transparent gas barrier layer as prescribed in the present invention can be continuously formed.

In each discharging space 32 (between the facing electrodes) formed between the rotatable roller electrode (first electrode) 35 and the square tube-shaped fixed electrode group (second electrode) 36, the first high frequency electric field with frequency $\omega_1$, electric field strength $V_1$ and electric current $I_1$ supplied from a first power source 41 is applied to the rotatable roller electrode (first electrode) 35, and a second high frequency electric field with frequency $\omega_2$, electric field strength $V_2$ and electric current $I_2$ supplied from the corresponding second power source 42 is applied to each square tube-shaped fixed electrode group (second electrode) 36, respectively.

A first filter 43 is provided between the rotatable roller electrode (first electrode) 35 and the first power source 41 and the first filter 43 is designed so that the electric current from the first power source 41 to the first electrode is easily passed and the electric current from the second power source 42 to the first electrode is difficultly passed by grounding. Furthermore, a second filter 44 is provided between the square tube-shaped fixed electrode (second electrode) 36 and the second power source 42 and the second filter 44 is designed so that the electric current from the second power source 42 to the second electrode is easily passed and the electric current from the first power source 41 to the second electrode is difficultly passed by grounding.

In the present invention, it is allowed to use the rotatable roller electrode 35 as the second electrode and the square tube-shaped fixed electrode 35 as the first electrode. In all cases, the first power source is connected to the first electrode and the second power source is connected to the second electrode. The first electrode preferably supplies high frequency electric field strength larger than that of the second power source ($V_1 > V_2$). The frequency can be $\omega_1 < \omega_2$.

The electric current is preferably $I_1 < I_2$. The electric current $I_1$ of the first high frequency electric field is preferably from 0.3 mA/cm$^2$ to 20 mA/cm$^2$ and more preferably from 1.0 mA/cm$^2$ to 20 mA/cm$^2$. The electric current $I_2$ of the second high frequency electric field is preferably from 10 mA/cm$^2$ to 100 mA/cm$^2$ and more preferably from 20 MA/cm$^2$ to 100 mA/cm$^2$.

Gas G generated by a gas generating apparatus 51 of the gas generating means 50 is controlled in the flowing amount and introduced into a plasma discharge treatment vessel 31 through a gas supplying opening.

The substrate F is unwound from a bulk roll not shown in the drawing or conveyed from a previous process and introduced into the apparatus trough a guide roller 64. Air accompanied with the substrate is blocked by a nipping roller 65. The substrate F is conveyed into the space between the square tube-shaped fixed electrode group and the rotatable roller electrode (first electrode) 35 while contacting and putting round with the rotatable roller electrode. Then the electric field is applied by both of the rotatable roller electrode (first electrode) 35 and the square tube-shaped fixed electrode group (second electrode) 36 for generating discharging plasma in the space 32 (discharging space) between the facing electrodes. A thin layer is formed on the substrate F by the gas in the plasma state on the substrate while contacting and putting round with the rotatable roller electrode 35. After that, the substrate F is wound up by a winder not shown in the drawing or transported to a next process through a nipping roller 66 and a guide roller 67.

The exhaust gas G' after the treatment is discharged from an exhaust opening 53.

For cooling or heating the rotatable roller electrode (first electrode) 35 and the square tube-shaped fixed electrode group (second electrode) 36 during the thin layer formation, a medium controlled in the temperature by an electrode temperature controlling means 60 is sent to the both electrodes by a liquid sending pump P through piping 61 to control the temperature of the electrodes from the interior thereof. 68 and 69 are partition plates for separating the plasma discharging treatment vessel 31 from the outside.

FIG. 4 shows an oblique view of the structure of an example of the rotatable roller electrode shown in FIG. 3 composed of an electroconductive metal base material and a dielectric material covering the base material.

In FIG. 4, the roller electrode 35*a* is composed of an electroconductive metal base 35A covered with a dielectric material 35B. The electrode is constituted so that the temperature controlling medium such as water and silicone oil can be circulated in the electrode for controlling the surface temperature of the electrode during the plasma discharging treatment.

Figure 5:
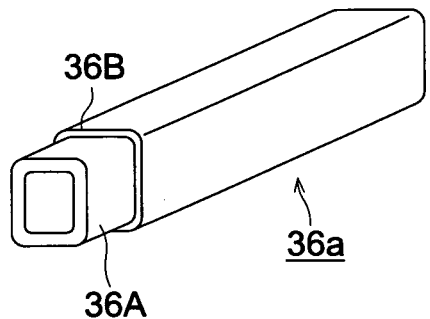
FIG. 5 is a perspective view showing an example of the conductive base metal for the square tube-shaped electrodes and the dielectric structure coated thereon.

FIG. 5 shows an oblique view of the structure of an example of the square tube-shaped electrode composed of an electroconductive metal base material and a dielectric material covering the core material.

In FIG. 5, a square tube-shaped electrode 36*a* is composed of an electroconductive metal base 36A having a cover of dielectric material 36B as same as shown in FIG. 5 and the electrode constitutes a metal pipe forming a jacket so that the temperature can be controlled during the discharging.

The plural square tube-shaped fixed electrodes are arranged along the circumstance larger than that of the roller electrode and the discharging area of the electrode is expressed by the sum of the area of the surface of the square tube-shaped electrodes facing to the rotatable roller electrode 35.

The square tube-shaped electrode 36*a* shown by FIG. 5 may be a cylindrical electrode but the square tube-shaped electrode is preferably used in the present invention since the square tube-shaped electrode is effective for increasing the discharging extent (discharging area) compared with the cylindrical electrode.

The roller electrode 35*a* and the square tube-shaped electrode 36*a* shown in FIGS. 4 and 5 are each prepared by thermal spraying ceramics as the dielectric material 35B or 36B on the metal base 35A or 35B and subjecting to a sealing treatment using a an inorganic sealing material. The thickness of the ceramics dielectric material may be about 1 mm. As the ceramics material for the thermal spraying, alumina and silicon nitride are preferably used, among them alumina, which can be easily processed, is particularly preferred. The dielectric layer may be a lining treated dielectrics formed by lining an inorganic material.

For the electroconductive metal base material 35A and 36B, a metal such as metal titanium and a titanium alloy, silver, platinum, stainless steel, aluminum and iron, a composite material of iron and ceramics and a composite material of aluminum and ceramics are usable and the metallic titanium and titanium alloy are particularly preferable by the reason mentioned later.

The distance between the facing first and second electrodes is the shortest distance between the surface of the dielectric layer and the surface of the electroconductive metal base material of the other electrode when the dielectric layer is provided on one of the electrodes.

The distance between the facing first and second electrodes is the shortest distance between the dielectric layer surfaces when the dielectric material is provided on both of the electrodes. The distance between the electrodes is decided considering the thickness of the dielectric material provided on the electroconductive metal base material, the strength of the applied electric field and the utilizing object of the plasma. The distance is preferably from 0.1 to 20 mm and particularly preferably from 0.5 to 2 mm in any cases from the viewpoint for performing uniform discharge.

Details of the electroconductive metal base material and the dielectric useful in the present invention material will be described later.

Though the plasma discharging treatment vessel 31 is preferably a glass vessel such as Pyrex® glass, a metal vessel can be used when the vessel can be insulated from the electrodes. For example, one constituted by a frame of aluminum or stainless steel covered on inside thereof by polyimide resin or one constituted by such the thermal sprayed with ceramics for giving insulating ability are usable. The both side surfaces in parallel of the both electrodes (near the core material surface) are preferably covered with the above-described material as shown in FIG. 2.

Examples of the first power source (high frequency power source) employed in the atmospheric pressure plasma processing apparatus of the present invention include the following power sources:

| Applied Power supply | Manufacturer | Frequency | Product name |
|---|---|---|---|
| A1 | Shinko Electric Co., Ltd. | 3 kHz | SPG3-4500 |
| A2 | Shinko Electric Co., Ltd. | 5 kHz | SPG5-4500 |
| A3 | Kasuga Electric Works, Ltd. | 15 kHz | AGI-023 |
| A4 | Shinko Electric Co., Ltd. | 50 kHz | SPG50-4500 |
| A5 | Haiden Laboratory | 100 kHz* | PHF-6k |
| A6 | Pearl Kogyo Co., Ltd. | 200 kHz | CF-2000-200k |
| A7 | Pearl Kogyo Co., Ltd. | 400 kHz | CF-2000-400k |

Any of the above commercially available power sources can be used in the present invention.

Examples of the second power source (high frequency power source include the following power sources:

| Applied Power supply | Manufacturer | Frequency | Product name |
|---|---|---|---|
| B1 | Pearl Kogyo Co., Ltd. | 800 kHz | CF-2000-800k |
| B2 | Pearl Kogyo Co., Ltd. | 2 MHz | CF-2000-2M |
| B3 | Pearl Kogyo Co., Ltd. | 13.56 MHz | CF-5000-13M |
| B4 | Pearl Kogyo Co., Ltd. | 27 MHz | CF-2000-27M |
| B5 | Pearl Kogyo Co., Ltd. | 150 MHz | CF-2000-150M |

Any of the above commercially available power sources can be used in the present invention.

Regarding the above described power supplies, the power supply marked * is an impulse high frequency power supply of Haiden Laboratory (100 kHz in continuous mode). High frequency power supplies other than the power supply marked * are capable of applying only continuous sine waves.

It is preferable that the power source which enables to keep a uniform and stable discharge state with supplying such an electric field is employed in the atmospheric pressure plasma discharge apparatus in the present invention.

In the present invention, when power is supplied across the facing electrodes, power (power density) of not less than 1 W/cm$^2$ is supplied to the second electrode (the second high frequency electric field) so as to excite the discharge gas to generate plasma. The energy is then given to the film forming gas, whereby a thin film is formed, and give the resulting energy to the discharge gas. The upper limit of the power supplied to the second electrode is preferably 50 W/cm$^2$, and more preferably 20 W/cm$^2$. The lower limit of the power supplied is preferably 1.2 W/cm$^2$. The discharge surface area (cm$^2$) refers to the surface area of the electrode at which discharge occurs.

Further, the power density can be enhanced while the uniformity of the second high frequency electric field is maintained, by supplying power (power density) of not less than 1 W/cm$^2$ to the first electrode (the first high frequency electric field), whereby more uniform plasma with higher density can be produced, resulting in improving both film forming rate and film quality. The power supplied to the first electrode is preferably not less than 5 W/cm$^2$. The upper limit of the power supplied to the first electrode is preferably 50 W/cm$^2$.

Herein, the waveform of the high frequency electric field is not specifically limited. There are a continuous oscillation mode which is called a continuous mode with a continuous sine wave and a discontinuous oscillation mode which is called a pulse mode carrying out ON/OFF discontinuously, and either may be used, however, a method supplying a continuous sine wave at least to the second electrode side (the second high frequency electric field) is preferred to obtain a uniform film with high quality.

The quality of the film can also be controlled by controlling the electric power of the second electrode.

In the present invention, in order to form the adjacent layer having predetermined difference of the elastic modulus, each layer is preferably formed by the method of the plasma CVD method under the atmospheric pressure or near atmospheric pressure under the condition that the plasma power density for film forming is in the range of ±50% of the average power density of each layers.

It is necessary that electrodes used in the atmospheric pressure plasma film forming method are structurally and functionally resistant to the use under severe conditions. Such electrodes are preferably those in which a dielectric is coated on a metal base material.

In the dielectric coated electrode used in the present invention, the dielectric and metal base material used in the present invention are preferably those in which their properties meet. For example, one embodiment of the dielectric coated electrodes is a combination of conductive metal base material and a dielectric in which the difference in linear thermal expansion coefficient between the conductive base material and the dielectric is not more than 10×10$^{-6}$/° C. The difference in linear thermal expansion coefficient between the conductive metal base material and the dielectric is preferably not more than 8×10$^{-6}$/° C., more preferably not more than 5×10$^{-6}$/° C., and most preferably not more than 2×10$^{-6}$/° C. Herein, the linear thermal expansion coefficient is a known physical value specific to materials.

Combinations of conductive base material and dielectric having a difference in linear thermal expansion coefficient between them falling within the range as described above will be listed below.

1: A combination of pure titanium or titanium alloy as conductive metal base material and a thermal spray ceramic layer as a dielectric layer 2: A combination of pure titanium or titanium alloy as conductive metal base material and a glass lining layer as a dielectric layer 3: A combination of stainless steel as conductive metal base material and a thermal spray ceramic layer as a dielectric layer 4: A combination of stainless steel as conductive metal base material and a glass lining layer as a dielectric layer 5: A combination of a composite of ceramic and iron as conductive metal base material and a thermal spray ceramic layer as a dielectric layer 6: A combination of a composite of ceramic and iron as conductive metal base material and a glass lining layer as a dielectric layer 7: A combination of a composite of ceramic and aluminum as conductive metal base material and a thermal spray ceramic layer as a dielectric layer 8: A combination of a composite of ceramic and aluminum as conductive metal base material and a glass lining layer as a dielectric layer.

In the viewpoint of the difference in the linear thermal expansion coefficient, preferable are above 1, 2, and 5-8, but specifically preferable is 1.

In the present invention, as a metal base metal material, titanium is useful with respect to the above-mentioned property. By using titanium or a titanium alloy as the metal base material and by using the above dielectric, the electrode can be used under a severe condition for a long time without deterioration of the electrode, specifically, a crack, peeling or elimination.

As an atmospheric pressure plasma discharge apparatus employable in the present invention, for example, those disclosed in JP-A Nos. 2004-68143 and 2003-49272 and WO02/48428 are included, together with described above.

EXAMPLES

The following is a detailed description of the present invention using examples, however, the present invention is not limited thereto.

Example

Production of the Transparent Gas Barrier Film 1

A transparent gas barrier film 1 composed two units each having the distribution profile constitution (uniform elastic modulus distribution pattern in each layer) shown in FIG. 1 are formed by providing UV curable acryl resin coating layer of 5 µm thickness on a polyethylene naphthalate film with a thickness of 125 µm (manufactured by Teijin Dupont and called PEN hereinafter) and by using the atmospheric plasma discharge treatment device and discharge conditions below.

(Atmospheric Plasma Discharge Treatment Device)

A set of a roll electrode coated by a dielectric substance and a plurality of square tube-shaped electrodes are produced as shown below using the atmospheric plasma discharge treatment device of FIG. 3.

In the roll electrode, or the first electrode, a jacket roll base metal material made of titanium alloy T64 having a cooling device using cooling water is coated with an alumina spray layer with high density and high adhesion according to an atmospheric plasma method such that the roll diameter is 1000 mm. Meanwhile, in the second electrode, or a square tube-shaped electrode, the square hollow cylinder made of titanium T64 is coated in thickness of 1 mm under the same condition as for the above dielectric to produce a square tube-shaped fixed electrode group facing each other.

Seventeen of these square cylinder are disposed around the rotatable roll electrode with an facing electrode interval of 1 mm. The total discharge area of the group of square tube-shaped fixed electrodes is 10,200 $cm^2$ which is obtained by 150 cm (width direction length)×4 cm (conveying direction length)×17 electrodes. It is noted that each has a suitable filter.

During plasma discharge process, the temperature adjustment and insulation is done such that the first electrode (rotatable roll electrode) and second electrode (square tube-shaped fixed electrode group) are 120° C., and rotatable roll electrode is rotated by a drive and layer formation is performed. Of the seventeen square tube-shaped fixed electrodes, one from the upstream side are used for forming the layer 3 described below, the next one is used for forming the layer 4 described below, the next one is used for forming the layer 5 described below, the next one is used for forming the layer 6 described below, the next ten are used for forming the layer 7 described below, the next one is used for forming the layer 8 described below, the next one is used for forming the layer 9 described below, and the remaining one is used to form the layer 10 described below, and the conditions are set so that the eight layers are laminated in one pass. These conditions are repeated twice to form the transparent gas barrier film 1, provided that amount of gas and electric power condition were adjusted for forming the layer 3 in the second unit to modify the thickness of 10 nm with same layer density.

(Layer 3)

Plasma discharge was carried out under the conditions below to form a layer 3 having a thickness of approximately 50 nm.

(Gas Conditions)

| | |
|---|---|
| Discharge gas: Nitrogen gas | 95.7 volume % |
| Layer forming gas: Hexamethyldisiloxane | 0.3 volume % |
| (abbreviated to HMDSO hereinafter) | |
| (Nitrogen gas is mixed and vaporized | |
| by a vaporizer manufactured by Lintec Co., Ltd..) | |
| Additive gas: Hydrogen gas | 4.0 volume % |

(Power Condition)
First Electrode Side
   Type of power source: High frequency power source manufactured by OYO Electric Co. Ltd
   Frequency: 80 kHz
   Output density: 8 $W/cm^2$
Second Electrode Side
   Type of power source: High frequency power source manufactured by Pearl Corporation
   Frequency: 13.56 MHz
   Output density: 7 $W/cm^2$ The elastic modulus of the layer 3 formed above was measured by Nano Indenter TMXP/DCM manufactured by MTS Systems Corporation and a result of 5 GPa was obtained.

(Layer 4)

Plasma discharge was carried out under the conditions below to form a layer 4 having a thickness of approximately 10 nm.

(Gas Conditions)

| | |
|---|---|
| Discharge gas: Nitrogen gas | 95.9 volume % |
| Layer forming gas: Tetraethoxysiloxane | 0.1 volume % |
| (abbreviated to TEOS hereinafter) | |
| (Nitrogen gas is mixed and vaporized | |
| by a vaporizer manufactured by Lintec Co., Ltd..) | |
| Additive gas: Hydrogen gas | 4.0 volume % |

(Power Conditions)
First Electrode Side
   Type of power source: High frequency power source manufactured by OYO Electric Co., Ltd.
   Frequency: 80 kHz
   Output density: 10 $W/cm^2$
Second Electrode Side
   Type of power source: High frequency power source manufactured by Pearl Kogyo Co., Ltd
   Frequency: 13.56 MHz
   Output density: 7 $W/cm^2$ The elastic modulus of the layer 4 formed above was measured by Nano Indenter TMXP/DCM manufactured by MTS Systems Corporation and a result of 18 GPa was obtained.

(Layer 5)

Plasma discharge was carried out under the conditions below to form a layer 5 having a thickness of approximately 5 nm.

(Gas Conditions)

| | |
|---|---|
| Discharge gas: Nitrogen gas | 94.9 volume % |
| Layer forming gas: Tetraethoxysiloxane | 0.1 volume % |
| (abbreviated to TEOS hereinafter) | |
| (Nitrogen gas is mixed and vaporized | |
| by a vaporizer manufactured by Lintec Co., Ltd..) | |
| Additive gas: Oxygen gas | 5.0 volume % |

(Power Conditions)
First Electrode Side
   Type of power source: High frequency power source manufactured by OYO Electric Co. Ltd
   Frequency: 80 kHz
   Output density: 10 $W/cm^2$
Second Electrode Side
   Type of power source: High frequency power source manufactured by Pearl Kogyo Co., Ltd.
   Frequency: 13.56 MHz
   Output density: 8 $W/cm^2$ The elastic modulus of the layer 5 formed above was measured by Nano Indenter TMXP/DCM manufactured by MTS Systems Corporation and a result of 33 GPa was obtained.

(Layer 6)

Plasma discharge was carried out under the conditions below to form a layer 6 having a thickness of approximately 5 nm.

(Gas Conditions)

| | |
|---|---|
| Discharge gas: Nitrogen gas | 94.9 volume % |
| Layer forming gas: Tetraethoxysiloxane | 0.1 volume % |
| (abbreviated to TEOS hereinafter) | |

(Nitrogen gas is mixed and vaporized
by a vaporizer manufactured by Lintec Co., Ltd..)
Additive gas: Oxygen gas                    5.0 volume %

(Power Conditions)
First Electrode Side
    Type of power source: High frequency power source manufactured by OYO Electric Co. Ltd
    Frequency: 80 kHz
    Output density: 10 W/cm$^2$
Second Electrode Side
    Type of power source: High frequency power source manufactured by Pearl Kogyo Co., Ltd.
    Frequency: 13.56 MHz
    Output density: 10 W/cm$^2$ The elastic modulus of the layer 6 formed above was measured by Nano Indenter TMXP/DCM manufactured by MTS Systems Corporation and a result of 47 GPa was obtained.

(Layer 7)

The elastic modulus of the layer 7 formed above was measured by Nano Indenter TMXP/DCM manufactured by MTS Systems Corporation and a result of 60 GPa was obtained.

(Layer 8)

Layer 8 having a thickness of approximately 5 nm was formed in the same conditions as Layer 6, except that the Output density at the second electrode was changed to 9 W/cm$^2$.

(Layer 9)

Layer 9 having a thickness of approximately 5 nm was formed in the same conditions as Layer 5, except that the Output density at the second electrode was changed to 7 W/cm$^2$.

(Layer 10)

Layer 10 having a thickness of approximately 10 nm was formed in the same conditions as Layer 4, except that the Output density at the second electrode was changed to 6 W/cm$^2$.

(Layers 11 to 18)

Layers 3 to 10 of the unit 1 were repeated in the same conditions to form transparent gas barrier film 1.

<Production of the Transparent Gas Barrier Films 2 to 7>

Transparent gas barrier films 2 to 7 were prepared in the same way as layers 3 to 10 (unit 1) in Example 1 wherein the film forming condition was modified so as to have different elastic modulus and layer thickness of each layers.

<Production of the Gas Barrier Film 8>

Transparent gas barrier film 8 with 2 units of the distribution profile constitution (pattern in which the elastic modulus has an graded distribution in the unit) are formed on the substrate by using the same atmospheric plasma discharge treatment device as that used in Example 1. This atmospheric plasma discharge treatment device has the twenty-four square tube-shaped electrodes around the rotatable roller electrode.

It is to be noted that in formation of the elastic modulus gradation pattern, the second electrode (square tube-shaped fixed electrode group) is inclined from the standard interval of 1 mm with respect to the first electrode (rotatable roll electrode) and the interval between the pair of second electrodes (square tube-shaped fixed electrode group) is changed.

Of the twenty-four square tube-shaped fixed electrodes, four from the upstream side are used for forming the first part described below, the next two are used for forming the second part described below, the next two are used for forming the fifth part, the next two are used for forming the sixth part, the next two are used for forming the seventh part, the next two are used for forming the eighth part, the next two are used for forming the ninth part, and the remaining four are used to form the tenth part, and the conditions are set so that the first layer to the tenth layer are laminated in one pass. The conditions are repeated twice to form the transparent gas barrier film 8.

(First Part)

Plasma discharge was carried out under the conditions below to form the first part having a thickness of approximately 90 nm.

(Gas Conditions)

| | |
|---|---|
| Discharge gas: Nitrogen gas | 94.8 volume % |
| Layer forming gas: Hexamethyldisiloxane | 0.2 volume % |
| (abbreviated to HMDSO hereinafter) | |
| (Nitrogen gas is mixed and vaporized | |
| by a vaporizer manufactured by Lintec Co., Ltd..) | |
| Additive gas: Oxygen gas | 5.0 volume % |

(Power Condition: Only the Power Source at the First Electrode Side is Used)
First Electrode Side
    Type of power source: High frequency power source manufactured by OYO Electric Co. Ltd
    Frequency: 80 kHz
    Output density: 10 W/cm$^2$
    Electrode incline angle: −2°

(Second Part)

Plasma discharge was carried out under the conditions below to form the second part having a thickness of approximately 30 nm.

(Gas Conditions)

| | |
|---|---|
| Discharge gas: Nitrogen gas | 94.85 volume % |
| Layer forming gas: Hexamethyldisiloxane | 0.15 volume % |
| (abbreviated to HMDSO hereinafter) | |
| (Nitrogen gas is mixed and vaporized by a | |
| vaporizer manufactured by Lintec Co., Ltd..) | |
| Additive gas: Oxygen gas | 5.0 volume % |

<Power Conditions: Only the Power Source for the First Electrode Side is Used>
First Electrode Side
    Type of power source: High frequency power source manufactured by OYO Electric Co., Ltd.
    Frequency: 80 kHz
    Output density: 10 W/cm$^2$
    Electrode incline angle: −2°

(Third Part)

Plasma discharge was carried out under the conditions below to form the third part having a thickness of approximately 30 nm.

(Gas Conditions)

| | |
|---|---|
| Discharge gas: Nitrogen gas | 94.85 volume % |
| Layer forming gas: Hexamethyldisiloxane | 0.15 volume % |
| (abbreviated to HMDSO hereinafter) | |
| (Nitrogen gas is mixed and vaporized by a | |
| vaporizer manufactured by Lintec Co., Ltd..) | |
| Additive gas: Oxygen gas | 5.0 volume % |

(Power Conditions)
First Electrode Side
    Type of power source: High frequency power source manufactured by OYO Electric Co., Ltd.
    Frequency: 80 kHz
    Output density: 10 W/cm$^2$
Second Electrode Side
    Type of power source: High frequency power source manufactured by Pearl Kogyo Co., Ltd
    Frequency: 13.56 MHz
    Output density: 5 W/cm$^2$
    Electrode incline angle: −2°

(Fourth Part)

Plasma discharge was carried out under the conditions below to form the fourth part having a thickness of approximately 30 nm.

(Gas Conditions)

| | |
|---|---|
| Discharge gas: Nitrogen gas | 94.9 volume % |
| Layer forming gas: Hexamethyldisiloxane (abbreviated to HMDSO hereinafter) (Nitrogen gas is mixed and vaporized by a vaporizer manufactured by Lintec Co., Ltd..) | 0.1 volume % |
| Additive gas: Oxygen gas | 5.0 volume % |

(Power Conditions)
First Electrode Side
    Type of power source: High frequency power source manufactured by OYO Electric Co., Ltd.
    Frequency: 80 kHz
    Output density: 10 W/cm$^2$
Second Electrode Side
    Type of power source: High frequency power source manufactured by Pearl Kogyo Co., Ltd
    Frequency: 13.56 MHz
    Output density: 5 W/cm$^2$
    Electrode incline angle: −2°

(Fifth Part)

Plasma discharge was carried out under the conditions below to form the fifth part having a thickness of approximately 45 nm.

(Gas Conditions)

| | |
|---|---|
| Discharge gas: Nitrogen gas | 94.85 volume % |
| Layer forming gas: Hexamethyldisiloxane (abbreviated to HMDSO hereinafter) (Nitrogen gas is mixed and vaporized by a vaporizer manufactured by Lintec Co., Ltd..) | 0.15 volume % |
| Additive gas: Oxygen gas | 5.0 volume % |

(Power Conditions)
First Electrode Side
    Type of power source: High frequency power source manufactured by OYO Electric Co., Ltd.
    Frequency: 80 kHz
    Output density: 10 W/cm$^2$
Second Electrode Side
    Type of power source: High frequency power source manufactured by Pearl Kogyo Co., Ltd
    Frequency: 13.56 MHz
    Output density: 10 W/cm$^2$
    Electrode incline angle: −2°

(Sixth Part)

Plasma discharge was carried out under the conditions below to form the sixth part having a thickness of approximately 45 nm.

(Gas Conditions)

| | |
|---|---|
| Discharge gas: Nitrogen gas | 94.85 volume % |
| Layer forming gas: Hexamethyldisiloxane (abbreviated to HMDSO hereinafter) (Nitrogen gas is mixed and vaporized by a vaporizer manufactured by Lintec Co., Ltd..) | 0.15 volume % |
| Additive gas: Oxygen gas | 5.0 volume % |

(Power Conditions)
First Electrode Side
    Type of power source: High frequency power source manufactured by OYO Electric Co., Ltd.
    Frequency: 80 kHz
    Output density: 10 W/cm$^2$
Second Electrode Side
    Type of power source: High frequency power source manufactured by Pearl Kogyo Co., Ltd
    Frequency: 13.56 MHz
    Output density: 10 W/cm$^2$
    Electrode incline angle: +2°

(Seventh Part)

Plasma discharge was carried out under the conditions below to form the seventh part having a thickness of approximately 30 nm.

(Gas Conditions)

| | |
|---|---|
| Discharge gas: Nitrogen gas | 94.9 volume % |
| Layer forming gas: Hexamethyldisiloxane (abbreviated to HMDSO hereinafter) (Nitrogen gas is mixed and vaporized by a vaporizer manufactured by Lintec Co., Ltd..) | 0.1 volume % |
| Additive gas: Oxygen gas | 5.0 volume % |

<Power Conditions>
First Electrode Side
    Type of power source: High frequency power source manufactured by OYO Electric Co., Ltd.
    Frequency: 80 kHz
    Output density: 10 W/cm$^2$
Second Electrode Side
    Type of power source: High frequency power source manufactured by Pearl Kogyo Co., Ltd
    Frequency: 13.56 MHz
    Output density: 5 W/cm$^2$
    Electrode incline angle: +2°

(Eighth Part)

Plasma discharge was carried out under the conditions below to form the eighth part having a thickness of approximately 30 nm.

(Gas Conditions)

| | |
|---|---|
| Discharge gas: Nitrogen gas | 94.85 volume % |
| Layer forming gas: Hexamethyldisiloxane (abbreviated to HMDSO hereinafter) (Nitrogen gas is mixed and vaporized by a vaporizer manufactured by Lintec Co., Ltd..) | 0.15 volume % |
| Additive gas: Oxygen gas | 5.0 volume % |

(Power Conditions)
First Electrode Side
    Type of power source: High frequency power source manufactured by OYO Electric Co., Ltd.
    Frequency: 80 kHz
    Output density: 10 W/cm$^2$ Second Electrode Side
   Type of power source: High frequency power source manufactured by Pearl Kogyo Co., Ltd
   Frequency: 13.56 MHz
   Output density: 5 W/cm²
   Electrode incline angle: +2°

(Ninth Part)

Plasma discharge was carried out under the conditions below to form the ninth part having a thickness of approximately 30 nm.

<Gas Conditions>

| | |
|---|---|
| Discharge gas: Nitrogen gas | 94.85 volume % |
| Layer forming gas: Hexamethyldisiloxane (abbreviated to HMDSO hereinafter) | 0.15 volume % |
| (Nitrogen gas is mixed and vaporized by a vaporizer manufactured by Lintec Co., Ltd..) | |
| Additive gas: Oxygen gas | 5.0 volume % |

<Power Conditions: Only Power Source at First Electrode Side is Used>
First Electrode Side
   Type of power source: High frequency power source manufactured by OYO Electric Co., Ltd.
   Frequency: 80 kHz
   Output density: 10 W/cm²
   Electrode incline angle: +2°

(Tenth Part)

Plasma discharge was carried out under the conditions below to form the tenth part having a thickness of approximately 90 nm.

(Gas Conditions)

| | |
|---|---|
| Discharge gas: Nitrogen gas | 94.0 volume % |
| Layer forming gas: Hexamethyldisiloxane (abbreviated to HMDSO hereinafter) | 1.0 volume % |
| (Nitrogen gas is mixed and vaporized by a vaporizer manufactured by Lintec Co., Ltd..) | |
| Additive gas: Oxygen gas | 5.0 volume % |

(Power Conditions: Only Power Source at First Electrode Side is Used)
First Electrode Side
   Type of power source: High frequency power source manufactured by OYO Electric Co., Ltd.
   Frequency: 80 kHz
   Output density: 10 W/cm²
   Electrode incline angle: +2°

(Formation of Eleventh Part to Twentieth Part)

The formation of the eleventh part to the twentieth part is repeated under the same conditions to form the first part to the tenth part (unit 1).

<<Evaluation of the Transparent Gas Barrier Film>>

[Measurement of Elastic Modulus Distribution]

Figure 6:
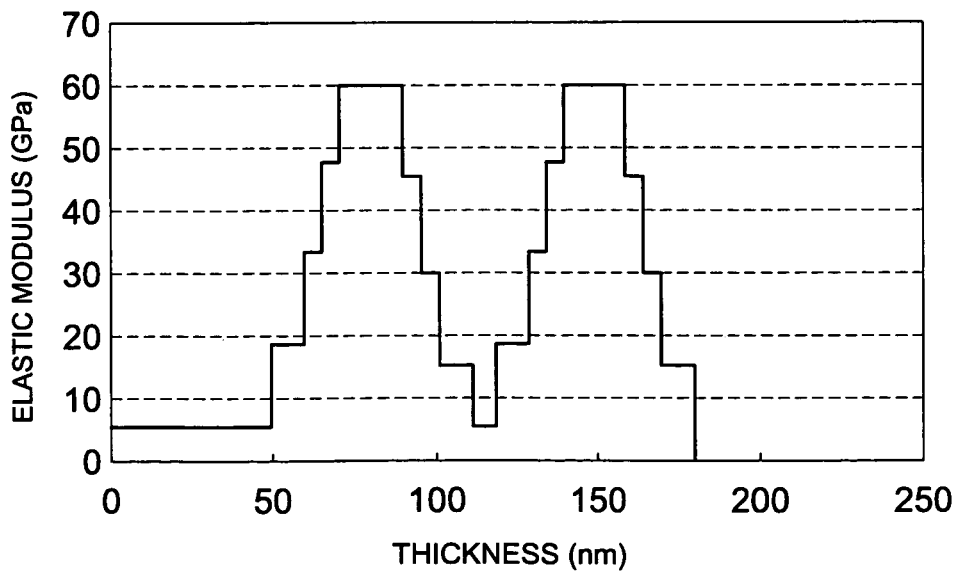
FIG. 6 illustrates graphs showing the results of the elastic modulus distribution profile measured by Nano Indenter TMXP/DCM manufactured by MTS Systems Corporation.
Figure 7:
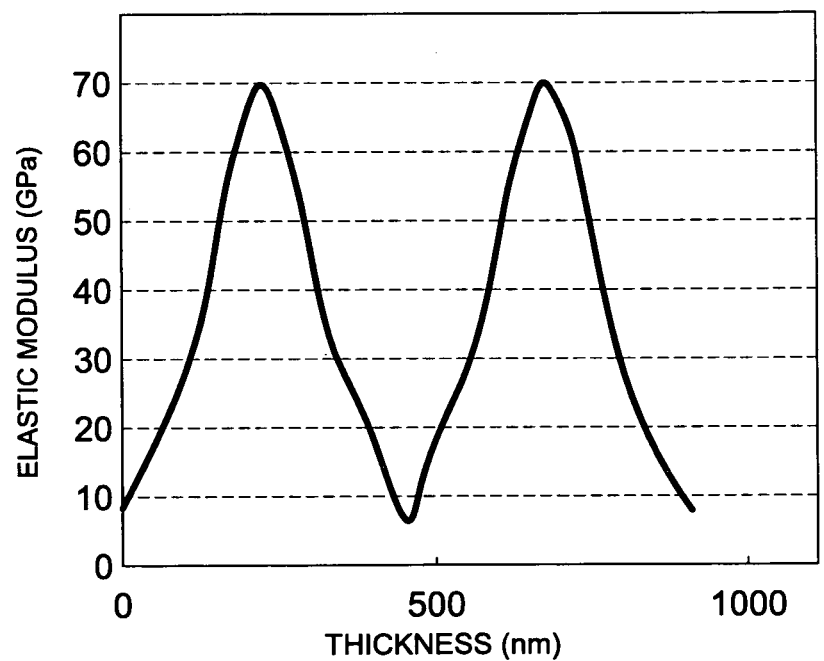
FIG. 7 illustrates graphs showing the results of the elastic modulus distribution profile measured by SA2000N manufactured by US Gatan, Inc.

Elastic modulus of each single layer with 300 nm thickness provided on the PEN film substrate having UV curable acryl coating layer was measured by Nano Indenter TMXP/DCM manufactured by MTS Systems Corporation. Elastic modulus can be measured without any influence of substrate in measurement by providing thickness of each layer more than 200 nm. Thickness and elastic modulus of each layers of each transparent gas barrier film obtained above are shown in Table 1. The results of the elastic modulus distribution profile measured by Nano Indenter TMXP/DCM manufactured by MTS Systems Corporation are shown in FIG. 6. Further the results of elastic modulus distribution profile measured by SA2000N manufactured by US Gastan, Inc are shown in FIG. 7.

The density ratio Y (=ρf/ρb) of the layer 7 is 1.0, wherein ρf represent a density of the layer 7 which has the maximum elastic modulus in the transparent gas barrier film, and ρb represent a density of a heat oxidized layer forming by heat oxidizing a base metal material of the layer. The residual stress of the layer is 0.1 MPa.

TABLE 1

| * | | Layer No. 3 | 4 | 5 | 6 | 7 | 8 | 9 | 10 | |
|---|---|---|---|---|---|---|---|---|---|---|
| 1 | Layer thickness (nm) | 50 | 10 | 5 | 5 | 20 | 5 | 5 | 10 | Invention |
| | Elastic modulus (GPa) | 5 | 18 | 33 | 47 | 60 | 45 | 30 | 15 | |
| 2 | Layer thickness (nm) | 50 | 10 | 5 | 5 | 20 | 5 | 5 | 5 | Invention |
| | Elastic modulus (GPa) | 5 | 20 | 35 | 50 | 60 | 50 | 35 | 20 | |
| 3 | Layer thickness (nm) | 50 | 10 | 5 | 5 | 20 | 5 | 5 | 5 | Comparative |
| | Elastic modulus (GPa) | 5 | 10 | 50 | 25 | 60 | 55 | 15 | 40 | |
| 4 | Layer thickness (nm) | 50 | 10 | 5 | 5 | 20 | 5 | 15 | 5 | Comparative |
| | Elastic modulus (GPa) | 5 | 50 | 25 | 55 | 60 | 50 | 35 | 18 | |
| 5 | Layer thickness (nm) | 50 | 5 | 15 | 5 | 20 | 5 | 5 | 10 | Comparative |
| | Elastic modulus (GPa) | 5 | 20 | 35 | 50 | 60 | 20 | 50 | 20 | |
| 6 | Layer thickness (nm) | 50 | 15 | 3 | 15 | 20 | 5 | 20 | 10 | Comparative |
| | Elastic modulus (GPa) | 10 | 25 | 40 | 50 | 60 | 45 | 30 | 20 | |
| 7 | Layer thickness (nm) | 50 | 15 | 5 | 5 | 20 | 15 | 5 | 10 | Comparative |
| | Elastic modulus (GPa) | 5 | 35 | 8 | 50 | 60 | 50 | 10 | 35 | |
| 8 | Layer thickness (nm) Elastic modulus (GPa) | Almost no interface, graded structure | | | | | | | | Comparative |

*: Transparent gas barrier film No.

Next the evaluation below were performed.
[Evaluation of Stability]
(Adhesion Evaluation)
Evaluation of adhesion for the transparent gas barrier film formed above was performed using a JIS K 5400 compliant cross-cut adhesion test.

Eleven lines were cut at an interval of 1 mm in the transverse and longitudinal directions on the surface of the gas barrier layer of the transparent gas barrier film with a single-edged blade normal to the layer surface to form one hundred 1 mm square grids. Then, cellophane adhesive tape available on the market was applied to the grid surface, and the tape, with one edge unattached, was sharply peeled away from the surface in the vertical direction. The rate of the area of the peeled layer to the area of the adhered tape was calculated, and evaluation was carried out according to the following criteria.

A: No peeled layer was observed.
B: The rate of the area of the peeled layer to the area of the adhered tape was not more than 10%.
C: The rate of the area of the peeled layer to the area of the adhered tape was more than 10%.

(Evaluation of Shelf Life)
Evaluation of adhesion transparent gas barrier film formed above was performed using same compliant cross-cut adhesion test as above after immersion 98° C. hot water for 48 hours according to the same evaluation standard.

(Evaluation of Ultraviolet Light Resistance)
Evaluation of adhesion transparent gas barrier film formed above was performed using same compliant cross-cut adhesion test after irradiation with 1500 mW/cm$^2$ ultraviolet rays for 96 hours using a metal halide lamp according to the same evaluation standard.

[Evaluation of Gas Barrier Properties]
(Measurement of Water Vapor Transmission Rate)
The water vapor transmission rate (g/m$^2$/24 hr) for the transparent gas barrier film formed above were measured using a JIS K 7129-1987 compliant method, under the condition of 25±0.5° C. and the relative humidity of 90±2% RH.

(Measurement of Impact Resistance)
Polyethylene terephthalate film having 10 μm thickness was covered on each of the transparent gas barrier films as prepared above, impact was given it 100 times by gravity drop of 10 mm cylinder applied with 200 g load from 100 mm height. After that the water vapor permeability (g/m$^2$/day) was measured by the same way as described above, deterioration of barrier performance was evaluated by the following criteria.

A: Difference ratio of the water vapor permeability (g/m$^2$/day) before and after impact is less than 5%.
B: Difference ratio of the water vapor permeability (g/m$^2$/day) before and after impact is not less than 5% to less than 10%.
C: Difference ratio of the water vapor permeability (g/m$^2$/day) before and after impact is not less than 10%.

The results are shown in Table 2.

TABLE 2

| Film No.* | Adhesion | Storage stability | UV ray resistance | Water vapor permeability | Impact resistance (g/m$^2$/day) | Remarks |
|---|---|---|---|---|---|---|
| 1 | A | A | A | <0.01 | A | Inv. |
| 2 | A | A | A | <0.01 | A | Inv. |
| 3 | A | B | A | <0.01 | A | Comp. |
| 4 | A | B | B | <0.01 | A | Comp. |
| 5 | A | B | B | <0.01 | A | Comp. |
| 6 | A | A | B | <0.01 | A | Comp. |
| 7 | A | B | B | <0.01 | A | Comp. |
| 8 | A | A | A | <0.01 | B | Comp. |

*Transparent gas barrier film No.

According to the present invention, the transparent gas barrier film has favorable performances.

What is claimed is:

1. A transparent gas barrier film comprising a layer unit A and a layer unit B in this order from a resin substrate, wherein
   an elastic modulus in the layer unit A gradually increases from a low elastic modulus layer to a high elastic modulus layer from the resin substrate, and
   an elastic modulus in the layer unit B gradually decreases from a high elastic modulus layer to a low elastic modulus layer from the resin substrate, and
   further comprising a layer unit C between the layer unit A and the layer unit B and which has an elastic modulus higher than the high elastic modulus layers in either of the layer unit A and the layer unit B,
   wherein a difference of elastic modulus of adjacent layers is not less than 1 GPa and not more than 20 GPa and each layer in the layer unit A and the layer unit B has a thickness of not less than 1 nm and not more than 10 nm.

2. The transparent gas barrier film of claim 1, wherein at least two units of composite unit at least composed of the layer unit A, the unit layer C and the layer unit B are layered from the resin substrate.

3. The transparent gas barrier film of claim 1, wherein the layer unit A is positioned at a resin substrate side.

4. The transparent gas barrier film of claim 1 consisting of the layer unit C between the layer unit A and the layer unit B.

5. A manufacturing method of a transparent gas barrier film, manufacturing the transparent gas barrier film of claim 1, wherein at least one of constitution layer is formed by a plasma CVD method at atmospheric pressure or approximately atmospheric pressure.

6. The manufacturing method of a transparent gas barrier film of claim 5, wherein a plasma output density for forming each of constitution layer is within a range of ±50% of the average plasma output density for forming each of constitution layer.

7. The transparent gas barrier film of claim 1, wherein a layer of maximum elastic modulus among the layers having different elastic modulus is a ceramic layer.

8. The transparent gas barrier film of claim 7, wherein a density ratio Y (=ρf/ρb) is 1≥Y>0.95 and a residual stress of the ceramic layer is not less than 0.01 MPa and not more than 10 MPa, wherein ρf is a density of the ceramic layer and ρb is a density of a thermal oxide layer or thermal nitride layer formed by thermally oxidation or thermally nitridation of a metal of a base material of the ceramic layer.

9. The transparent gas barrier film of claim 7, wherein the ceramic layer comprises at least one selected from silicon oxide, silicon nitride, silicon oxide nitride and aluminum oxide.

* * * * *